United States Patent
Mao et al.

(10) Patent No.: US 9,562,931 B2
(45) Date of Patent: Feb. 7, 2017

(54) DEVICES AND METHODS FOR SENSING CURRENT

(75) Inventors: Xinhui Mao, Morristown, NJ (US); Huabin Fang, Morristown, NJ (US)

(73) Assignee: Honeywell International Inc., Morris Plains, NJ (US)

( * ) Notice: Subject to any disclaimer, the term of this patent is extended or adjusted under 35 U.S.C. 154(b) by 165 days.

(21) Appl. No.: 14/353,315

(22) PCT Filed: Nov. 2, 2011

(86) PCT No.: PCT/CN2011/081683
§ 371 (c)(1),
(2), (4) Date: Aug. 27, 2014

(87) PCT Pub. No.: WO2013/063773
PCT Pub. Date: May 10, 2013

(65) Prior Publication Data
US 2014/0361767 A1    Dec. 11, 2014

(51) Int. Cl.
*G01R 19/00* (2006.01)
*G01R 33/09* (2006.01)
*G01R 15/20* (2006.01)

(52) U.S. Cl.
CPC ......... *G01R 19/0092* (2013.01); *G01R 15/207* (2013.01); *G01R 33/096* (2013.01); *G01R 33/098* (2013.01)

(58) Field of Classification Search
CPC . G01R 19/0092; G01R 33/098; G01R 33/096; G01R 15/207
USPC ....... 324/251, 245, 246, 247, 249, 252, 260, 324/261, 262, 263
See application file for complete search history.

(56) References Cited

U.S. PATENT DOCUMENTS

| | | | |
|---|---|---|---|
| 2007/0279175 A1 | 12/2007 | Lin | |
| 2011/0121827 A1* | 5/2011 | Yakymyshyn | ....... G01R 15/207 324/251 |
| 2014/0288444 A1* | 9/2014 | Dekker | ................ A61B 5/6851 600/486 |

FOREIGN PATENT DOCUMENTS

| | | |
|---|---|---|
| CN | 2876787 Y | 3/2007 |
| CN | 2909275 Y | 6/2007 |
| CN | 201000810 Y | 1/2008 |
| CN | 101696989 A | 4/2010 |
| CN | 102012447 A | 4/2011 |
| CN | 201804026 U | 4/2011 |
| JP | 6385462 A | 4/1988 |
| JP | 2004325373 A | 11/2004 |

(Continued)

OTHER PUBLICATIONS

First Chinese Office Action from related PCT Application PCT/CN2011/081683 dated Oct. 8, 2015, 24 pp.

(Continued)

*Primary Examiner* — Jermele M Hollington
*Assistant Examiner* — Khristopher Yodichkas
(74) *Attorney, Agent, or Firm* — Brooks, Cameron & Huebsch, PLLC

(57) ABSTRACT

Devices and methods for sensing current are described herein. One device (100) includes a base member (102) having a first leg (104, 106) and a second leg (104, 106), the legs (104, 106) defining an angle (108) therebetween, a first magnetic current sensor (110, 112) coupled to the base member (102) and positioned at a first location in a plane bisecting the angle (108), and a second magnetic current sensor (110, 112) coupled to the base member (102) and positioned at a second location in the plane bisecting the angle (108).

18 Claims, 2 Drawing Sheets

(56) References Cited

FOREIGN PATENT DOCUMENTS

WO     20090210076 A1    2/2009

OTHER PUBLICATIONS

International Search Report from related PCT Application PCT/CN2011/081683 dated Aug. 9, 2012, 2 pp.
Second Chinese Office Action from related PCT Application PCT/CN2011/081683 dated Jun. 23, 2016, 21 pages.
Decision on Rejection from related Chinese Patent Application No. 201180074635, dated Oct. 26, 2016, 17 pp.

\* cited by examiner

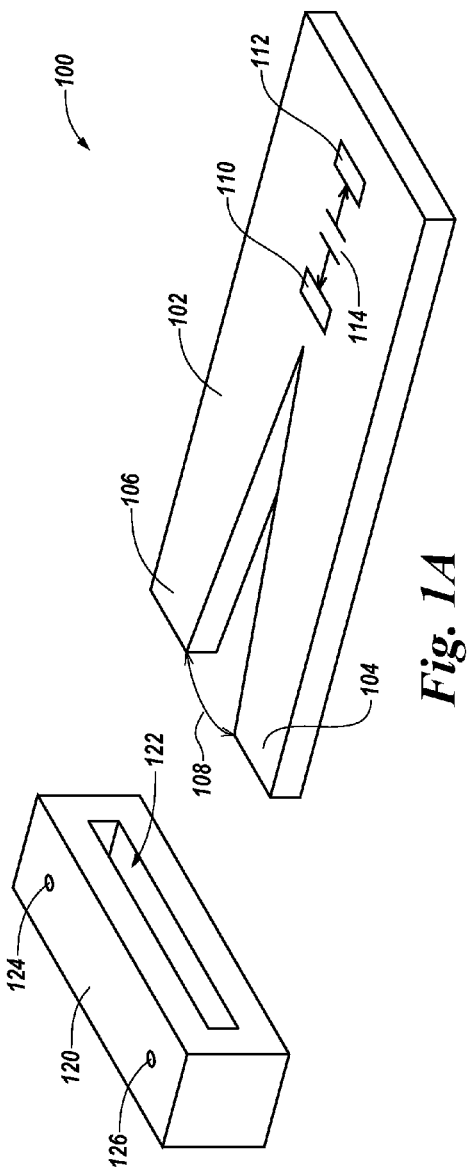
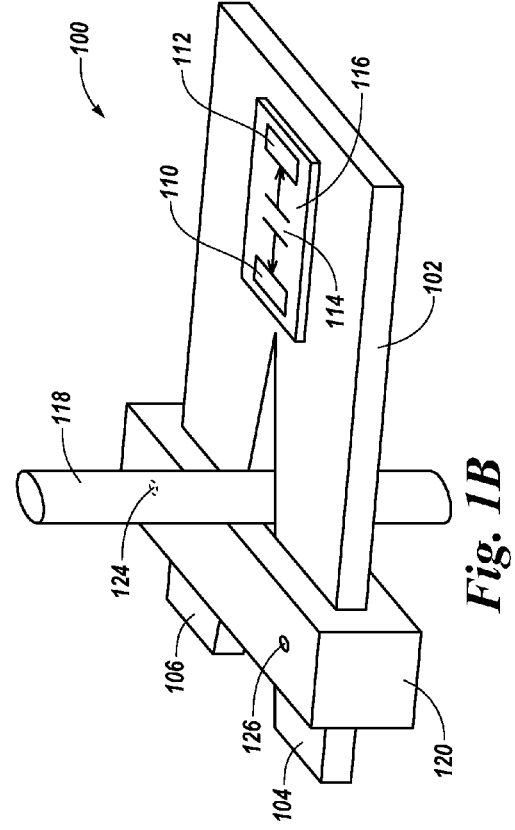
Fig. 1A
Fig. 1B

DEVICES AND METHODS FOR SENSING CURRENT

TECHNICAL FIELD

The present disclosure relates to devices and methods for sensing current.

BACKGROUND

A current through a circuit conductor (e.g., a wire) may be determined (e.g., sensed, acquired, and/or measured) based on a magnetic field generated by the circuit conductor as the current passes through the circuit conductor. Determining current based on a magnetic field may allow the current to be measured without physically contacting the circuit conductor, for example.

Some previous approaches for determining current based on a magnetic field may use a magnetic core to concentrate the magnetic flux produced by the current. Such approaches may, for example, place a single magnetic current sensor in a gap of the magnetic core.

Approaches for determining current that use a magnetic core, however, may use a large amount of space (e.g., volume) and/or power. Additionally, such approaches may be expensive to produce because, for example, they may have a complicated structure and/or many components. Additionally, such approaches may be prone to measurement errors due to, for example, residual magnetization associated with the magnetic core.

BRIEF DESCRIPTION OF THE DRAWINGS

FIGS. 1A and 1B illustrate a current sensor in accordance with one or more embodiments of the present disclosure.

DETAILED DESCRIPTION

Figure 2:
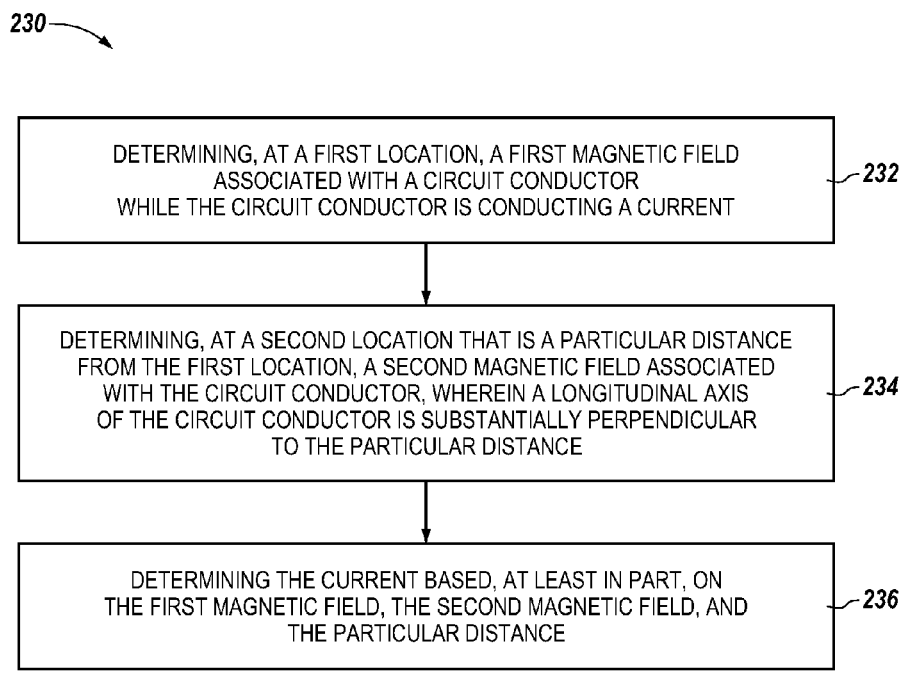
FIG. 2 is a block diagram of a method for sensing a current in accordance with one or more embodiments of the present disclosure.

Devices and methods for sensing current are described herein. For example, one or more embodiments include a base member having a first leg and a second leg, the legs defining an angle therebetween, a first magnetic current sensor coupled to the base member and positioned at a first location in a plane bisecting the angle, and a second magnetic current sensor coupled to the base member and positioned at a second location in the plane bisecting the angle.

One or more embodiments of the present disclosure can sense a current associated with a circuit conductor based on a magnetic field generated by the circuit conductor as the circuit conductor conducts the current. For example, one or more embodiments of the present disclosure can sense a current without the use of a magnetic core.

Because one or more embodiments of the present disclosure can sense current without using a magnetic core, one or more embodiments of the present disclosure can sense current using a smaller amount of space (e.g., volume) and/or power than previous approaches (e.g., approaches in which current is sensed using a magnetic core). Additionally, one or more embodiments of the present disclosure can sense current using a less complicated structure and/or fewer components than previous approaches. Further, sensing current in accordance with one or more embodiments of the present disclosure can reduce and/or eliminate errors (e.g., measurement errors) associated with the sensed current.

Additionally, one or more embodiments of the present disclosure can be easily installed (e.g., secured) onto a circuit conductor because the circuit conductor does not need to be cut for installation, for example.

In the following detailed description, reference is made to the accompanying drawings that form a part hereof. The drawings show by way of illustration how one or more embodiments of the disclosure may be practiced. These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1A, and a similar element may be referenced as 102 in FIG. 1B.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

As used herein, "a" or "a number of" something can refer to one or more such things. For example, "a number of magnetic current sensors" can refer to one or more magnetic current sensors.

FIGS. 1A and 1B illustrate a current sensor 100 in accordance with one or more embodiments of the present disclosure. FIG. 1A illustrates current sensor 100 while current sensor 100 is not secured to a circuit conductor, and FIG. 1B illustrates current sensor 100 secured to a circuit conductor 118.

As shown in FIGS. 1A and 1B, current sensor 100 includes a base member 102 having a first leg 104 and a second leg 106. In some embodiments, the legs 104 and 106 can define an angle 108 therebetween. The embodiment illustrated in FIGS. 1A and 1B include a triangular (e.g., V-shaped) junction of legs 104 and 106, though embodiments of the present disclosure are not limited to a particular shape and/or junction of legs 104 and 106.

Base member 102 can be various materials including, for example, a printed circuit board (PCB) and/or non-magnetic materials (e.g., polyamide, polyvinyl chloride, polypropylene, polycarbonate, etc.), though embodiments of the present disclosure do not limit base member 102 to a particular material. As discussed below (e.g., in connection with FIG. 1B), current sensor 100 can include a plate (e.g., plate 116) on a surface of base member 102, for example.

As shown in FIGS. 1A and 1B, base member 102 can include a first magnetic current sensor 110 and a second magnetic current sensor 112. Embodiments of the present disclosure do not limit base member 102 to include a particular number of magnetic current sensors (e.g., base member 102 can include more than 2 magnetic current sensors). Magnetic current sensors 110 and/or 112 can be positioned on a plane bisecting angle 108 and can be a particular distance 114 apart, as illustrated in FIGS. 1A and 1B.

Magnetic current sensors 110 and 112 can be one or more of various types of sensors configured to sense (e.g., detect, measure, and/or acquire) magnetic field data. For example, magnetic current sensors 110 and/or 112 can be and/or include Hall effect elements, anisotropic magnetoresistance (AMR) sensors and/or tunneling magnetoresistance (TMR) sensors, among other types of sensors. Magnetic field data can include, for example, a gradient and/or magnitude (e.g., intensity, level, and/or strength) of a magnetic field, among other magnetic field data.

As illustrated in FIGS. 1A and 1B, current sensor 100 includes a fastener 120 having an opening 122 therein. Opening 122 can receive legs 104 and/or 106 (e.g., a distal portion of legs 104 and/or 106). Embodiments of the present disclosure do not limit fastener 120 to a particular material. Rather, as discussed further below in connection with FIG. 1B, fastener 120 can include various fasteners configured to engage (e.g., fixably engage) legs 104 and 106.

Fastener 120 can be adjusted by threaded screws 124 and/or 126, for example. In some embodiments, fastener 120 can receive distal portions of legs 104 and 106 into opening 122 and can be adjustably secured to current sensor 100 via threaded screws 124 and/or 126. For example, threaded screws 124 and/or 126 can frictionally engage a surface of legs 104 and/or 106, and/or can be threaded into one or more openings on legs 104 and/or 106, among other engagement types.

Opening 122 can be an opening through fastener 120 or can pass through a portion thereof. Further, opening 122 can be various sizes and/or shapes; embodiments of the present disclosure do not limit opening 122 to a particular appearance and/or structure.

FIG. 1B illustrates current sensor 100 secured to circuit conductor (e.g., wire) 118 in accordance with one or more embodiments of the present disclosure. As previously discussed, and as shown in the embodiment illustrated in FIG. 1B, base member 102 can have a plate 116 thereon. Plate 116 can be, for example, a printed circuit board (PCB) and/or can be attached to base member 102 by various means (e.g., solder, glue, mechanical fastener(s), etc.).

In the embodiment illustrated in FIG. 1B, legs 104 and 106 are shown secured to fastener 120 by threaded screws 124 and 126 through an opening (e.g., opening 122 previously discussed in connection with FIG. 1A). As shown in FIG. 1B, a surface of fastener 120 can engage circuit conductor 118. Additionally and/or alternatively, circuit conductor 118 can be engaged by legs 104 and/or 106 (e.g., an inner surface of legs 104 and/or 106).

When secured to legs 104 and/or 106, a surface of fastener 120 can be sufficiently flat (as shown in FIG. 1B) such as to engage circuit conductor 118 and securely position base portion 102 in a plane substantially perpendicular to circuit conductor 118 (e.g., a longitudinal axis of circuit conductor 118). Such a perpendicular position can allow magnetic current sensors 110 and/or 112 to accurately determine a magnetic field associated with circuit conductor 118, as discussed below in connection with FIG. 2.

FIGS. 1A and 1B illustrate embodiments of fastener 120; however, the present disclosure does not limit fasteners to the illustrated embodiments. Rather, fastener 120 can be various fasteners capable of securing sensor 100 to a circuit conductor (e.g., circuit conductor 118). For example, fastener 120 can include binding components (e.g., hook-and-loop fasteners, lashings, etc.), clamps, adhesives, and/or various mechanical fasteners, among others.

Although not illustrated in FIGS. 1A and/or 1B for clarity and so as not to obscure embodiments of the present disclosure, current sensor 100 can include a conductive shield (e.g., soft-magnetic conductive shield) surrounding a portion of current sensor 100. Such a shield can be made from various conductive and/or soft magnetic materials and can surround a portion and/or the entirety of current sensor 100 and/or circuit conductor 118. Shielding can prevent external magnetic fields (e.g., fields associated with additional circuit conductors) from affecting magnetic field data acquisition by sensors 110 and/or 112.

In some embodiments, current sensor 100 does not include a magnetic core. Benefits of not including a magnetic core can include, for example, using a smaller amount of space (e.g., volume) and/or power than approaches using a magnetic core. Additionally, not using a magnetic core can allow current sensor 100 to use a less complicated structure and/or fewer components than approaches using a magnetic core. Further, not using a magnetic core can allow current sensor 100 to reduce and/or eliminate errors (e.g., measurement errors) associated with the sensed current.

FIG. 2 is a block diagram of a method 230 for sensing a current in accordance with one or more embodiments of the present disclosure. Method 230 can be performed, for example, using sensor 100 illustrated in FIGS. 1A and 1B.

At block 232, method 230 includes determining, at a first location, a first magnetic field associated with a circuit conductor (e.g., circuit conductor 118 previously described in connection with FIG. 1B) while the circuit conductor is conducting a current. The first magnetic field can be determined, for example, by magnetic current sensor 110 (e.g., at the location of magnetic current sensor 110), previously discussed in connection with FIGS. 1A and/or 1. Operation of sensor 110 can depend on a type and/or design of sensor 110, thus embodiments of the present disclosure do not limit the measuring and/or determining of a magnetic field to a particular operation.

At block 234, method 230 includes determining, at a second location that is a particular distance from the first location, a second magnetic field associated with the circuit conductor, wherein a longitudinal axis of the circuit conductor is substantially perpendicular to the particular distance. Determining the second magnetic field can include sensor 112 determining the magnetic field created by circuit conductor 118 at the location of sensor 112, previously discussed in connection with FIGS. 1A and/or 1B, for example. The particular distance can be distance 114, previously discussed in connection with FIG. 1A and/or 1B, for example.

At block 236, method 230 includes determining the current based, at least in part, on the first magnetic field, the second magnetic field, and the particular distance. For example, the determined magnetic field measured at the first location (e.g., the magnetic field determined by magnetic sensor 110) can be referred to as B1. In an analogous manner, the determined magnetic field measured at the second location (e.g., the magnetic field determined by magnetic sensor 112) can be referred to as B2. The particular distance between the first location and the second location (e.g., distance 114) can be referred to as D. Another distance (e.g., an unknown distance) between the circuit conductor (e.g., circuit conductor 118) and the first location can be referred to as R.

Using a constant associated with the permeability of free space (e.g., the magnetic constant), $\mu_0$, the current (I) can be determined as follows, for example, using the Biot-Savart law:

$$B1 = \frac{I\mu_0}{2\pi R};$$

$$B2 = \frac{I\mu_0}{2\pi(R+D)};$$

then $$I = \frac{2\pi D(B1)(B2)}{\mu_0(B1-B2)}.$$

Although not shown in FIG. 2, method 230 can include determining a frequency of a power supply associated with the circuit conductor. For example, in the absence of a magnetic core to conduct the magnetic field associated with the circuit conductor, additional (e.g., undesired) data can be measured by magnetic current sensors 110 and/or 112. Such data can include an external magnetic field associated with another circuit conductor and/or a magnetic field associated with the earth, for example, among other magnetic fields.

Determining a frequency of a power supply associated with the circuit conductor to be measured (e.g., circuit conductor 118) can allow some embodiments of the present disclosure to discount (e.g., disregard) additional and/or undesired magnetic field data. Determining a frequency of the power supply can be used in addition to, and/or alternative to, the use of a conductive shield structure, such as that previously discussed in connection with FIG. 1A and/or 1B.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A current sensor, comprising:
   a base member having a first leg and a second leg, the legs defining an angle therebetween;
   a first magnetic current sensor coupled to a surface of the base member and positioned at a first location in a plane perpendicular to the base member and bisecting the angle; and
   a second magnetic current sensor coupled to the surface of the base member and positioned at a second location in the plane bisecting the angle.

2. The current sensor of claim 1, wherein the current sensor does not include a magnetic core.

3. The current sensor of claim 1, wherein at least one of the magnetic current sensors includes a tunneling magnetoresistance element.

4. The current sensor of claim 1, wherein at least one of the magnetic current sensors includes an anisotropic magnetoresistance element.

5. The current sensor of claim 1, wherein:
   the base member includes a printed circuit board; and
   the magnetic current sensors are coupled to the printed circuit board.

6. The current sensor of claim 1, wherein the base member is a non-conductive material.

7. The current sensor of claim 1, wherein the current sensor is configured to determine a current associated with a circuit conductor responsive to the base member being positioned in a plane substantially perpendicular to a longitudinal axis of the circuit conductor while the circuit conductor is conducting the current.

8. The current sensor of claim 1, wherein the current sensor includes a fastener securable to the first leg and the second leg.

9. The current sensor of claim 1, wherein the current sensor includes a fastener including an opening configured to receive a portion of the first leg and a portion of the second leg.

10. The current sensor of claim 1, further comprising a soft-magnetic conductive shield surrounding a portion of the current sensor.

11. The current sensor of claim 8, wherein the fastener is configured to secure the current sensor to a circuit conductor such that the circuit conductor engages an inner edge of the first leg, an inner edge of the second leg, and an inner edge of the fastener.

12. The current sensor of claim 8, wherein the fastener is configured to engage the first leg and the second leg such that a face of the fastener is substantially perpendicular to a surface of the base member.

13. The current sensor of claim 8, wherein the fastener includes an opening configured to receive a portion of the first leg and a portion of the second leg.

14. The current sensor of claim 1, wherein the base member includes at least one of polyamide, polyvinyl chloride, polypropylene, and polycarbonate.

15. A method of sensing a current, comprising:
   determining a first magnetic field associated with a circuit conductor while the circuit conductor is conducting a current using a first magnetic current sensor of a device, the first magnetic current sensor coupled to a surface of a base member of the device having a first leg and a second leg defining an angle therebetween, wherein the first magnetic current sensor is positioned at a first location in a plane perpendicular to the base member and bisecting the angle;
   determining a second magnetic field associated with the circuit conductor using a second magnetic current sensor of the device, the second magnetic current sensor coupled to the surface of the base member of the device and positioned at a second location in the plane bisecting the angle, wherein the second location is a particular distance from the first location, and wherein a longitudinal axis of the circuit conductor is substantially perpendicular to the particular distance; and determining the current based, at least in part, on the first magnetic field, the second magnetic field, and the particular distance.

16. The method of claim 15, wherein the method includes determining a magnitude of the magnetic field.

17. The method of claim 15, wherein the method includes:
determining a frequency of a power supply associated with the circuit conductor; and
determining the current based, at least in part, on the frequency of the power supply.

18. The method of claim 15, wherein the first location and the second location are in a plane perpendicular to the longitudinal axis of the circuit conductor.

* * * * *